US012768889B1

(12) United States Patent
Ropp et al.

(10) Patent No.: US 12,768,889 B1
(45) Date of Patent: Oct. 20, 2026

(54) ACCIDENTAL MESH PREVENTION RELAY

(71) Applicant: National Technology & Engineering Solutions of Sandia, LLC, Albuquerque, NM (US)

(72) Inventors: Michael E. Ropp, Albuquerque, NM (US); Matthew J. Reno, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 181 days.

(21) Appl. No.: 18/758,359

(22) Filed: Jun. 28, 2024

Related U.S. Application Data

(60) Provisional application No. 63/523,765, filed on Jun. 28, 2023.

(51) Int. Cl.
*G01R 31/327* (2006.01)
*G01R 19/00* (2006.01)

(52) U.S. Cl.
CPC ....... *G01R 31/3278* (2013.01); *G01R 19/003* (2013.01)

(58) Field of Classification Search
CPC .......................... G01R 31/3278; G01R 19/003
USPC ...................... 324/500, 600, 76.11, 415–433
See application file for complete search history.

(56) References Cited

U.S. PATENT DOCUMENTS 7,339,913 B2 * 3/2008 Chou ...................... H04W 8/04 370/338
11,063,472 B1 * 7/2021 Ashrafi .................. G06Q 50/06
12,086,012 B2 * 9/2024 Jake ...................... G06F 11/328
2008/0002608 A1 * 1/2008 Zheng .................. H04L 45/302 370/328
2009/0141661 A1 * 6/2009 Li ........................ H04W 76/27 370/311
2012/0265360 A1 * 10/2012 Smit ..................... H02H 7/262 700/293
2020/0403406 A1 * 12/2020 Shafiullah ............. G06N 3/084
2024/0222973 A1 * 7/2024 Zhang ....................... H02J 3/08

OTHER PUBLICATIONS

Maurer, L. et al., "Tales From the Frontier: Keys to Successful Self-Healing Distribution Projects," IEEE Power and Energy Magazine (2012) 10(6):100-106.

* cited by examiner

*Primary Examiner* — Huy Q Phan
*Assistant Examiner* — Trung Q Nguyen
(74) *Attorney, Agent, or Firm* — Daniel J. Jenkins

(57) ABSTRACT

Self-healing or self-assembling power systems that rely on local measurements for decision making can provide significant resilience benefits, but they also must include safeguards that prevent the system from self-assembling into an undesirable configuration. One situation that must be avoided is the formation of closed loops for which the system was not designed, a situation that can arise any time that two power systems can be connected in more than one place, for example if tie-line breakers are included in a self-assembling power system or if an intentional-island system can connect to the larger grid at more than one location. A line relay is used to determine whether closing a switch controlled by that line relay would result in the formation of a closed loop, using only local measurements.

9 Claims, 9 Drawing Sheets

ACCIDENTAL MESH PREVENTION RELAY

RELATED APPLICATIONS

This application claims priority to U.S. Provisional Patent Application No. 63/523,765, entitled "ACCIDENTAL MESH PREVENTION RELAY," filed Jun. 28, 2023, the disclosure of which is incorporated herein in its entirety.

STATEMENT OF GOVERNMENT INTEREST

The United States Government has rights in this invention pursuant to Contract No. DE-NA0003525 between the United States Department of Energy and National Technology & Engineering Solutions of Sandia, LLC, both for the operation of the Sandia National Laboratories.

FIELD

The present disclosure is directed to power system controls and protection, and more particularly directed to self-healing power systems.

BACKGROUND

A self-healing power system (SHePS) has the ability to automatically detect that the system is not operating within desired parameters, and to restore as much of the system as possible to normal operation. Typically, a SHePS does this by reconfiguring itself via switches and tie lines to route power around damaged or faulted equipment, in such a way that the maximum amount of load remains served. Two classes of engineering challenges associated with SHePS are a) locating and isolating the damaged or faulted equipment; and b) ensuring that during the self-assembly process the SHePS does not enter a configuration that is infeasible or undesirable.

A considerable amount of work has been done on various types of SHePS over the last two decades, and some SHePS techniques are mature. One SHePS technology, commonly called Fault Location Isolation and Service Restoration (FLISR), is commercially available. Today's SHePS technologies typically address the two engineering challenges described above via sharing of data over a high-speed communications network between devices and a central controller (a centralized architecture) or between devices directly via a distributed architecture. Such systems have shown considerable promise, but in practical applications, the communications systems can be expensive, often suffer from scalability issues, and may become unreliable during natural or human-caused disruptions. Maurer et. al., in "Tales From the Frontier: Keys to Successful Self-Healing Distribution projects,' IEEE Power and Energy Magazine 10(2), March/April 2012, p. 100-106, described the situation thus: "Communications is the Achilles' Heal [sic] of any self-healing system. No matter what type of self-healing system you select—centralized, substation-based, or distributed intelligence—that fact is still true."

Today, the problem exists that protection of SHePS energized by distributed inverter-based resources relies on data sharing via high-speed communications that can be prohibitively expensive, are not readily scalable, suffer from cyber vulnerabilities, and may become unreliable during the very events under which the SHePS is most needed.

What is needed are systems and methods that satisfy one or more of these needs or provide other advantageous features. Other features and advantages will be made apparent from the present specification. The teachings disclosed extend to those embodiments that fall within the scope of the claims, regardless of whether they accomplish one or more of the aforementioned needs.

SUMMARY OF THE DISCLOSURE

The present disclosure is directed to a line relay that calculates the correlation or the mean absolute error (MAE) between two local frequency measurements made on either side of the circuit breaker associated with the line relay; compares the correlation or MAE between these frequencies over time; and determines if a change in the correlation or MAE identifies that closing a specific switch or breaker would create an unintentional loop. In other embodiments, other comparisons of linear regression slopes may be used.

The present disclosure is further directed to a power system architecture and includes one or more line relays that calculate the correlation or the mean absolute error (MAE) between two local frequency measurements made on either side of the circuit breaker associated with the line relay; compares the correlation or MAE between these frequencies over time; and determines if a change in the correlation or MAE identifies that closing a specific switch or breaker would create an unintentional loop.

The present disclosure is further directed to a method that calculates the correlation or the mean absolute error (MAE) between two local frequency measurements made on either side of the circuit breaker associated with a line relay; compares the correlation or MAE between these frequencies over time; and determines if a change in the correlation or MAE identifies that closing a specific switch or breaker would create an unintentional loop.

The present disclosure is further directed to a line relay that includes a processor that measures voltage on either side of the line relay, calculates frequency on either side of the line relay, and determines correlation or mean absolute error (MAE) between the frequency on either side of a line relay. Tthe processor compares the correlation or MAE between the determined frequencies over time and determines if a change in the correlation or MAE identifies that closing a specific switch would create or not create an unintentional loop in a power system, the processor sending out a signal to the line relay to close the line relay upon determining that closing the switch would not create an unintentional loop; and a switch.

The present disclosure is further directed to a power system that includes at least two portions of the power system that can be electrically separated from one another and a line relay electrically connecting the at least two portions of the power system. The line relay includes a processor that measures voltage on either side of the line relay, calculates frequency on either side of the line relay, and determines correlation or mean absolute error (MAE) between the frequency on either side of a line relay, the processor compares the correlation or MAE between the determined frequencies over time and determines if a change in the correlation or MAE identifies that closing a specific switch would create or not create an unintentional loop in a power system, the processor sending out a signal to the line relay to close the line relay upon determining that closing the switch would not create an unintentional loop; and a switch for closing the electrical connection between the first and second power distribution circuits.

The present disclosure is further directed to a method for preventing a closed loop in a power system that includes disposing between a first and a second power distribution circuit a line relay that determines a safe condition for closing the line relay. The line relay includes a processor that measures voltage on either side of the line relay, calculates frequency on either side of the line relay, and determines correlation or mean absolute error (MAE) between the frequency on either side of a line relay, the processor compares the correlation or MAE between the determined frequencies over time and determines if a change in the correlation or MAE identifies that closing a specific switch would create or not create an unintentional loop in a power system, the processor sending out a signal to the line relay to close the line relay upon determining that closing the switch would not create an unintentional loop; and a switch.

DETAILED DESCRIPTION OF THE DISCLOSURE

Disclosed herein are new and useful techniques for electric power systems, such as self-healing or self-assembling power systems, that use local measurements for decision making that provide significant resilience benefits and also include safeguards that prevent the system from self-assembling into an undesirable configuration. One potential undesirable configuration would be the formation of closed loops for which the system was not designed, a situation that can arise any time that two electric power systems can be connected in more than one place, e.g. if tie-line breakers are included in the self-assembling system or if an intentional-island system has the capability to interconnect to the grid at more than one point. The disclosed systems and methods provide configurations that avoid unintentional loop formation problems in electric power systems. The systems and methods include calculating the correlation or the mean absolute error (MAE) between the two local frequency measurements made on either side of the circuit breaker or switch controlled by a line relay, which from hereforth may be collectively referred to as a "line relay" or "relay." The correlation and MAE between these frequencies change significantly between the loop and non-loop cases, and this difference can be used for loop detection. The disclosure provides for two embodiments, one based on correlation and one based on mean absolute error.

The power systems and methods disclosed herein are techniques that do not share data between devices and instead rely only on local measurements. They provide a minimum-cost, high-flexibility technique that avoids the problems associated with communications-dependent systems described above. In an embodiment, these systems and methods may be used as backups to communications-based systems.

One unacceptable configuration that must typically be avoided during self-assembly is the creation of closed loops. Most North American distribution is not designed to be looped, and unintentional formation of loops can lead to operational problems, such as paralleling of tap-changing voltage-regulating transformers or issues with protection not designed for looped circuits. Consider the example power system shown in FIG. 1.

Figure 1:
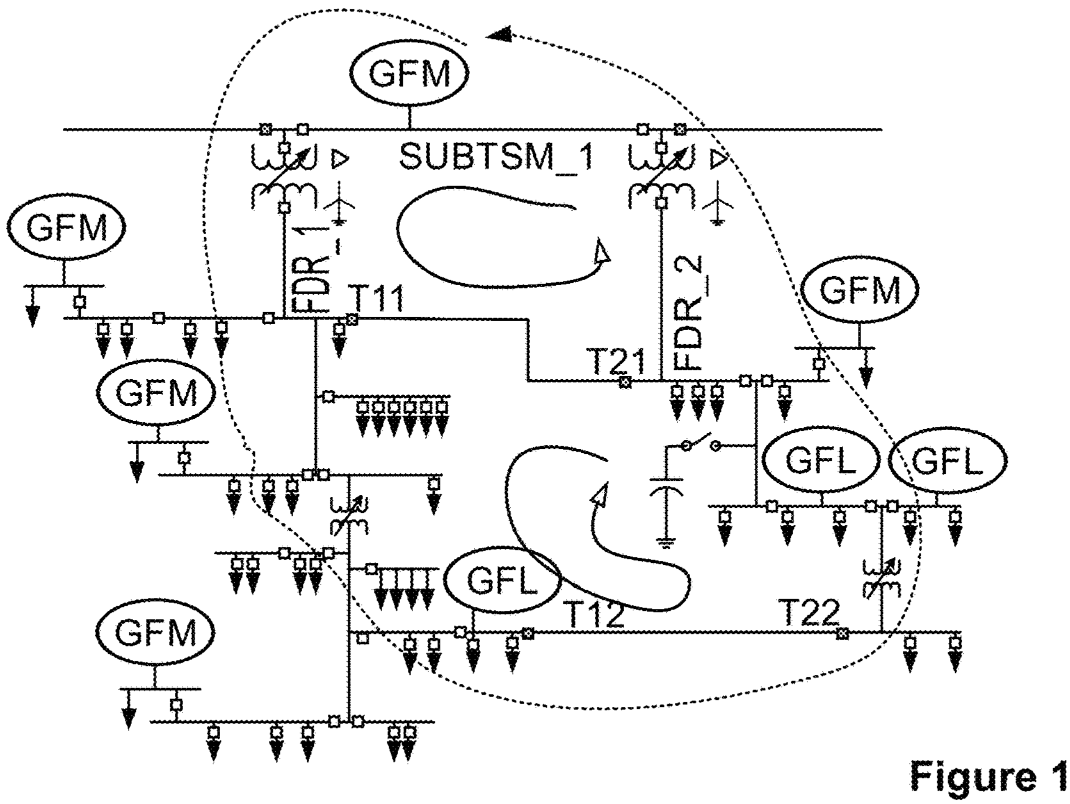
FIG. 1 illustrates an example SHePS including two distribution circuits and a portion of a subtransmission circuit, showing the locations of potential closed-loop paths according to an embodiment of the disclosure.

FIG. 1 illustrates a power system that includes a segment of a subtransmission circuit and two distribution circuits according to an embodiment of the disclosure. In an embodiment, the distribution circuits may be microgrids. The two dashed lines on the SUBSTM 1 side of the circuit are connections to the rest of a power grid. Grid-forming sources are labeled "GFM", and grid-following sources "GFL". GFM sources are able to independently regulate voltage and frequency, and can thus independently energize a power system. GFL sources use the voltage provided by GFM sources as a reference, and in that sense, GFL sources "follow" GFM sources. As such, both GFL and GFM are power providers to the distribution circuits. The red boxes indicate closed breakers, and the green boxes indicate open breakers. Note that in this embodiment, the microgrid includes two breakers on each of the two tie lines (T11-T21, and T12-T22). However, in other embodiments, each set of breakers may be replaced by a single tie line breaker. For example, T11-T12 can be replaced by a single T13 so that only one breaker exists on a tie line. This system includes two normally-open tie lines between breakers T11-T21 and T12-T22. If the tie-line breakers were automated as part of the SHePS scheme, there are three ways in which closed loops could be formed in this microgrid, shown by dashed red loops, all of which would include step-regulating transformers.

Each line relay that can potentially form a loop between distribution circuits and within distribution circuits looks at the voltage on each side of its breaker, and calculates the frequencies of those voltages. In this exemplary embodiment, the T11-T21 and T12-T22 breakers and associated line relays may form loops as well as other breakers and associated line relays within the distribution circuits. As understood in the art, the line relays are those relays directly in the circuit and do not include the source relays, the relays between the GFMs and the circuit, and the load relays, which are described below.

The relay uses a comparison of the two frequencies using correlation or MAE, and interprets the correlation or MAE value to decide whether closure of that breaker would create a closed loop. The tie relays thus prevent the creation of a closed circle in a system not designed for a closed system. It is important to prevent loop formation in any line relay, because we can't always guarantee the order in which they'll close—in some circumstances a tie line may close before some of the other line relays In some power systems, such as a self-assembling power system, it is necessary that the relay controlling each tie-line breaker or breakers includes a function that uses only its own local measurements to enable that relay to determine whether closure of that relay breaker would create a closed loop, and if so, block closure of that relay's breaker. As such, each relay controls a breaker. The relay measures the voltage on each side of its controlled breaker and the current through the controlled breaker. By "local measurements", we mean that the relay only "knows" what it is measuring at its own breaker; it doesn't have communicated information from other relays to know what they are seeing.

In FIG. 1, the downward-pointing arrows under the relays represent loads. Loads encompass anything that consumes electric power, and may include but are not limited to domestic and commercial loads such as but not limited to motors and appliances. Multiple arrows under the relays indicate multiple loads. Each load has a load relay/breaker associated with it, and if the box is red, then the breaker is closed. The label SUBSTM 1—indicates a subtransmission circuit, which is a higher-voltage circuit that transmits power from the bulk transmission system to distribution circuits. FDR 1 and FRD 2 indicate distribution feeder circuits, and as can be seen in FIG. 1, there are two feeder circuits in this example. Between the feeder circuits and the subtransmisison, there are two associated transformers. The arrows across the transformers indicate that the transformer is adjustable (it has a "tap changer", so the transformation ratio across the transformer can be adjusted in steps). The two symbols next to the transformer indicate how it is connected electrically: the top one is a triangle, and the bottom one is an upside-down Y with a grounding symbol connected to its center. This is referred to as being electrically connected "delta-Y grounded". Within the distribution circuits are two adjustable transformers, these adjustable transformers may be referred to as line regulators.

Under normal operating conditions, the two distribution circuits are each connected to the SUBSTM 1. There is no need for T11-T21 or T12-T22 to be closed. Should FDR 1 or FDR 2 become isolated from SUBSTM 1, either T11-T21 or T12-T22 may be closed to allow power transmission across the distribution circuits so that both distribution circuits can maintain power connectivity to SUBSTM 1. It should be appreciated, and as discussed below, that only one pathway between the distribution circuits can be closed as closing both pathways would result in a closed loop that could lead to a number of malfunctions because the system is not designed for closed-loop operation.

For line relays within the distribution circuits, the breakers of those line relays may be closed or open in normal operating conditions. For those relays, this disclosure addresses the case wherein a line relay breaker may be open for an operational need, and it is desired to close that breaker. The line relay, using the system and method disclosed herein, determines from local voltage measurements on both sides of the breaker, and the corresponding determined frequency, if it is a safe operation condtion to close the breaker so as to not cause an unintentional loop.

The loop-detection function only needs to operate in a situation in which the relay controlling an open line breaker detects in-range ("good") voltage and frequency on both sides of the breaker. If there is a "good" voltage on one side only, then the other side is de-energized and closing of that relay cannot form a loop. The loop detection function will operate in coordination with a synchronization check (sync-check) function that ensures that the voltages on both sides of the relay have a sufficiently-close match in magnitude and phase angle. Because the frequencies on either side of the line relay may be similar, the sync-check function may take tens of seconds to reach phase matching. This consideration, combined with the fact that both sides of the relay are already energized so there is no load not being served, means that the loop detection function does not need to be especially fast; it could take 10 to 20 seconds to operate without causing unacceptable system performance degradation.

The disclosed systems and methods prevent the unintentional formation of closed loops in power systems such as SHePS by using only local measurements. The systems and methods use statistical analysis of the voltage frequencies on either side of the relay to detect whether the systems on either side are independent or interconnected. The physical mechanism of operation of the method is explained, implementations of the method using two different statistical parameters (correlation and mean absolute error) are described, and the operation of the method is demonstrated via simulation.

Theory and Proposed Method

Figure 2:
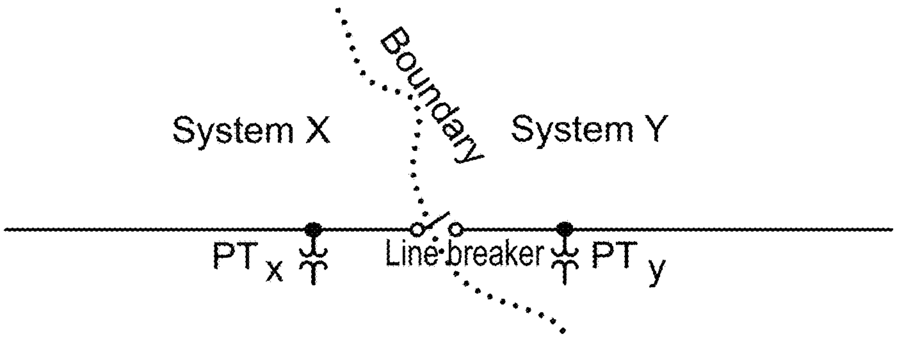
FIG. 2 illustrates an example of a line relay controlling a circuit breaker on the boundary between two subsystems with measurements on each side of the boundary according to an embodiment of the disclosure.

Consider an open line breaker that is on the boundary between two power systems x and y, as shown in FIG. 2. $PT_x$ and $PT_y$ are the potential transformers (PTs) on either side of the open breaker. This open line breaker can be energized from either side, so the relay controlling this breaker uses the two PTs to make voltage measurements in both systems. Both voltage measurements are made by the same relay, so time synchronization of the measurements is straightforward. If systems x and y are completely independent of one another, then closing the line breaker will network systems x and y so that they can share resources, and closure can be permitted. If systems x and y are already connected at another point, however, connecting this line breaker will form a closed loop through that existing point of interconnection, so closure must be blocked.

The sources in the intentionally-islanded systems will use a frequency droop function, for example a linear droop function expressed as $$f(t)=f_0+m(P(t)-P_0) \tag{1}$$

where f(t) is the operating frequency at time t, $f_0$ is the operating frequency corresponding to power $P_0$, P(t) is the power being drawn from the source at time t (i.e., the load power at time t) and m is the desired slope of the power-frequency droop line. The load power P(t) can be expressed as a combination of an average component, $P_{avg}$, and a randomly-varying component, $P_{rand}$:

$$P=P_{avg}+P_{rand}(t) \tag{2}$$

Substituting Eq. (2) into Eq. (1) shows that the operating frequency f(t) also has a random component:

$$f_{rand}(t)+f_{avg}=mP_{rand}(t)+[f_0+m(P_{avg}-P_0)] \tag{3}$$

Figure 3:
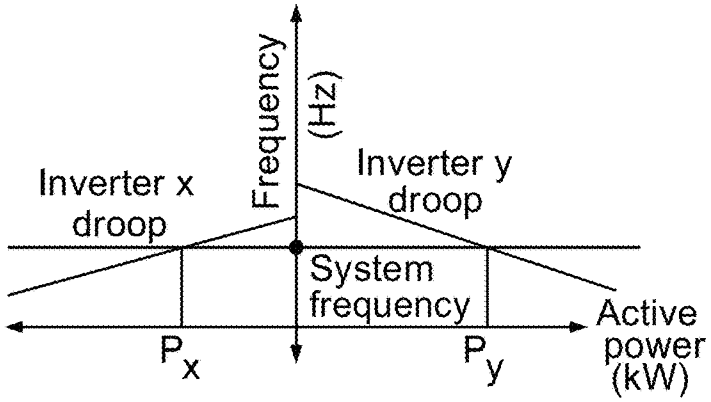
FIG. 3 is a house diagram for the sources in systems x and y from FIG. 2.

When two sources are in independent, non-connected systems, their load variations $P_{xrand}(t)$ and $P_{yrand}(t)$ will be independent (an assertion that is demonstrated via measured data in the following section of this disclosure). Reflecting each of these independent power vectors off of the droop curve of each source using Eq. (3) results in two f(t) vectors with independent $f_{xrand}(t)$ and $f_{yrand}(t)$ components. On the other hand, if systems x and y are interconnected, then their sources share a total load and a common frequency as shown in the house diagram in FIG. 3, and their f(t) vectors will be strongly correlated. (There will be short-duration transient variations in frequency that can be uncorrelated, but in most cases, these high-speed frequency variations are filtered out of the measurements.)

Thus, if the frequency vectors on either side of the line breaker in FIG. 2 are independent, the closure of that line breaker by its line relay will not lead to the formation of a loop, but if the frequency vectors are not independent, then the closure of that line breaker by its line relay should be blocked because such closure would form a closed loop. The independence or non-independence of the two frequency vectors can be identified via any of several statistical comparisons of the vectors. For example, Pearson's correlation r between the two frequency vectors would be expected to yield very close to +1.0 when the two systems are connected, but would vary between +/−1.0 when they are independent. Similarly, it would be expected that the average error at each time step between the two frequency vectors would be much larger when the systems are independent than when they are connected. Thus, the mean absolute error (MAE) between the two frequency vectors would be expected to be orders of magnitude smaller when the systems are connected than when they are independent. The systems and methods for unintentional loop detection based on both Pearson's r and the MAE are demonstrated via PSCAD simulations herein. Herein, correlation calculations are based on Pearson's r. However, in other embodiments, any valid statistical correlation calculation procedure, such as, but not limited to Pearson's r, Spearman's rho (ρ), or Kendall's tau (τ), may be used.

Figure 4:
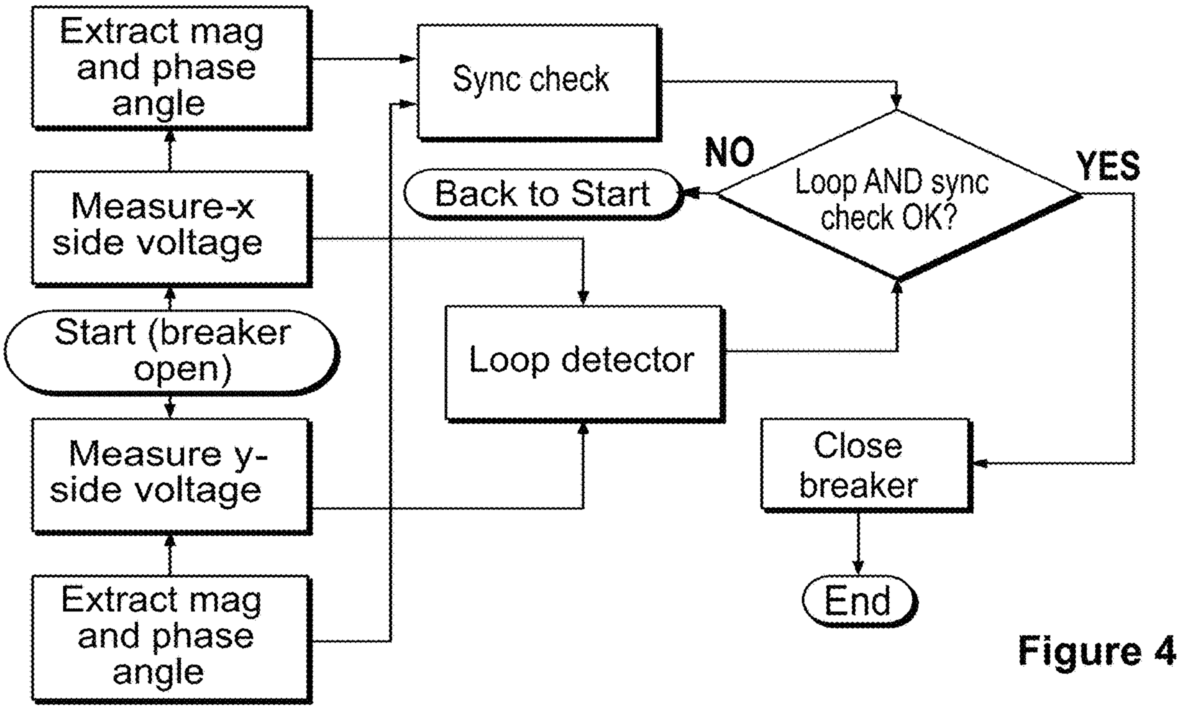
FIG. 4 is a flow diagram for loop detection and sync check according to an embodiment of the disclosure.

A flow diagram illustrating the decision-making process for the closure of the line relay in FIG. 2 is shown in FIG. 4. The process starts at the center-left with the breaker open. The x- and y-side voltages are measured and are processed in two ways: extraction of magnitude and phase for the sync check, and calculation of the frequency correlation or MAE for the loop detector. If both the loop detector and the sync check determine that breaker closure is allowed, then the line relay closes the breaker and the process terminates until the breaker is open again.

The line relay includes a physical connection to a circuit breaker or controllable switch, and a processor with a non-transient memory including instructions that, with an initial start with the breaker open, measure x- and y-side opposing side voltages, and processing those voltages in one of two ways: extraction of magnitude and phase for the sync check, and calculation of the correlation or MAE for the loop detector. If both the loop detector and the sync check determine that breaker closure is allowed, then the line relay closes the breaker and the process terminates until the breaker is open again.

Demonstration of Non-Correlation of Geographically Adjacent Loads

Either implementation of the proposed method of unintentional loop detection relies on there being an uncorrelated variation between the loads in adjacent microgrids, over a time window of a few seconds to a few tens of seconds. This independence of loads is what gives rise to the differences in correlation or MAE that make unintentional loop detection possible. Because of the reliance of the method on this property of loads, it is important to demonstrate that real-world loads actually do have this property. Thus, to demonstrate this lack of correlation between real-world loads, two sets of 1-second load data, one measured at the individual residence level and one measured at the feeder-head level, were analyzed using MATLAB, a proprietary multi-paradigm programming language and numeric computing environment developed by MathWorks. This section presents the results of those analyses.

A. Data from Ota City, Japan

Figure 5:
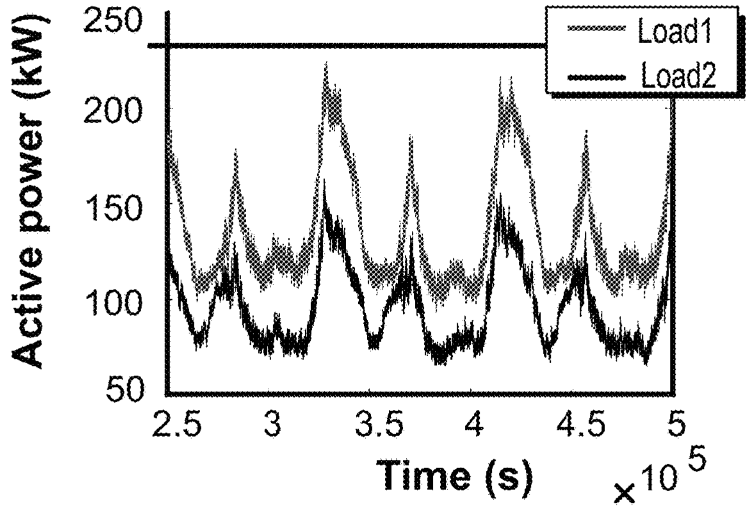
FIG. 5 shows active power demand vs. time at 1-s resolution of the two synthetic microgrids, using the June 2007 data from Ota City, Japan, according to an embodiment of the disclosure.

The first data set includes two years' worth of 1-second data measured at the individual residence level for 586 residences in Ota City, Japan. These residences are geographically clustered (all within a roughly 1 km×1 km area) and served by the same distribution circuit. Correlations were calculated between each pair of individual residences, and also between two synthetic 'microgrids' created by summing the first 260 residences (1-260) and the next 260 residences (261-520) into two aggregates. The synthetic microgrids are the more difficult case for the loop detection method, so those results are presented here. FIG. 5 shows a sample of the power demand of these two synthetic microgrids, using a portion of the June 2007 data. It can be seen in FIG. 5 that the microgrids' loads do correlate over longer intervals—for example, there is a clear diurnal correlation in the loads—but superimposed onto this is a higher-frequency noise that results from the shorter-term individual load switching referred to earlier in this paper. That higher-frequency variation is the variation on which the loop detection method will rely. The load data are measured at a 1-s interval, meaning that the Nyquist frequency is only 0.5 Hz. Some load variation that is relevant to this method will be faster than this, but that higher-rate variation will be aliased to lower frequencies in these data.

Figure 6:
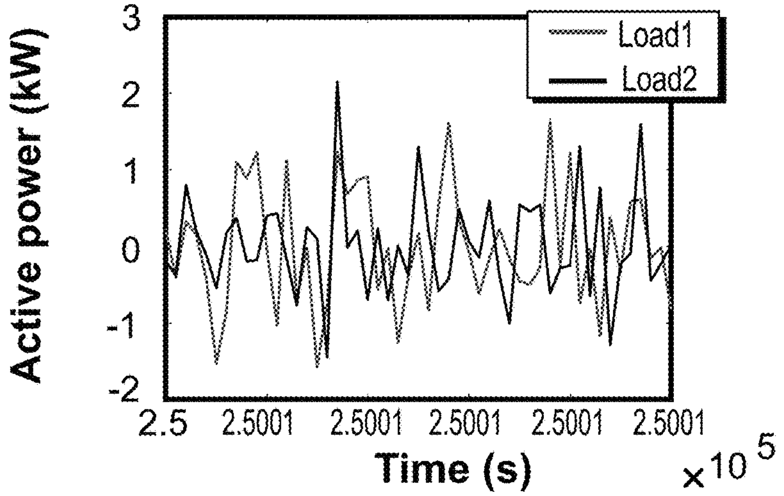
FIG. 6 shows a zoomed-in view of the active power demand of the two synthetic microgrids, after removal of the DC offset between them according to an embodiment of the disclosure.

FIG. 6 shows a tightly zoomed view of the 1-s active power demand of the two microgrids, after high-pass filtering to remove the DC offset. It is visually apparent that these loads are changing independently; short times can be found in FIG. 6 in which the loads are well-correlated, anticorrelated, and uncorrelated. Thus, if one ran a Pearson's correlation calculation on these data, one might expect a "noisy" correlation result that oscillates between +1 and −1.

Figure 7:
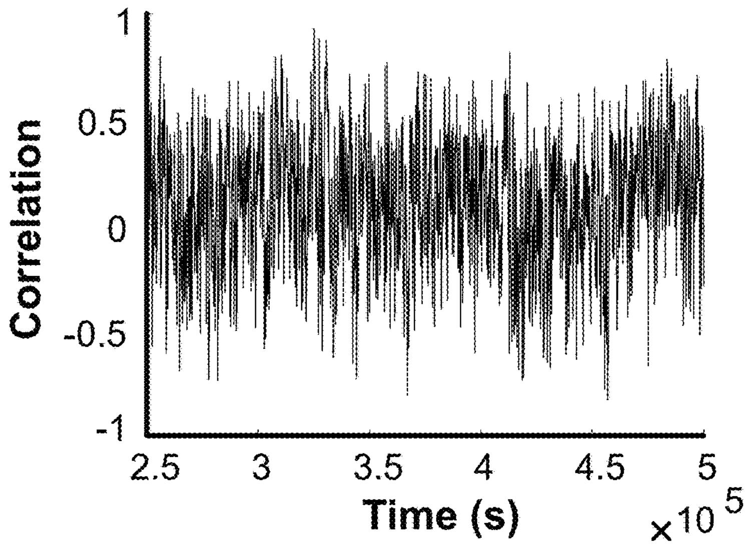
FIG. 7 shows Pearson's correlation vs. time between the power demand of two aggregated 'synthetic microgrids' using the June 2007 Ota City data according to an embodiment of the disclosure.
Figure 8:
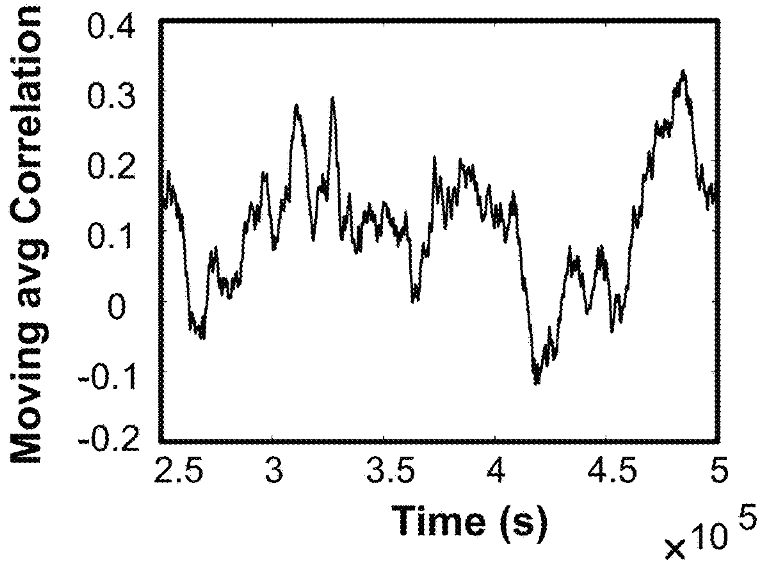
FIG. 8 shows moving-average correlation vs. time between the power demand of two aggregated 'synthetic microgrids' using the June 2007 Ota City data according to an embodiment of the disclosure.

FIG. 7 shows the unfiltered Pearson's correlation coefficient versus time between the two microgrids' active power demand, using a 7200-point buffer. As expected from the visual inspection of the data, the correlation appears oscillatory, fluctuating over a range of almost ±0.9 with approximately zero mean. FIG. 8 shows a moving-average filtered version of the correlation in FIG. 7, showing that the mean value of the correlation is low.

B. Data from Cordova AK

The second set of data contains two years' worth of 1-second data from the Cordova Electric Cooperative (CEC) system in Cordova, AK, measured at the whole-feeder level. There are five data sets, measured at five separate feeder head-ends fed from a common main bus. FIGS. 9-12 show results from this data set.

Figure 9:
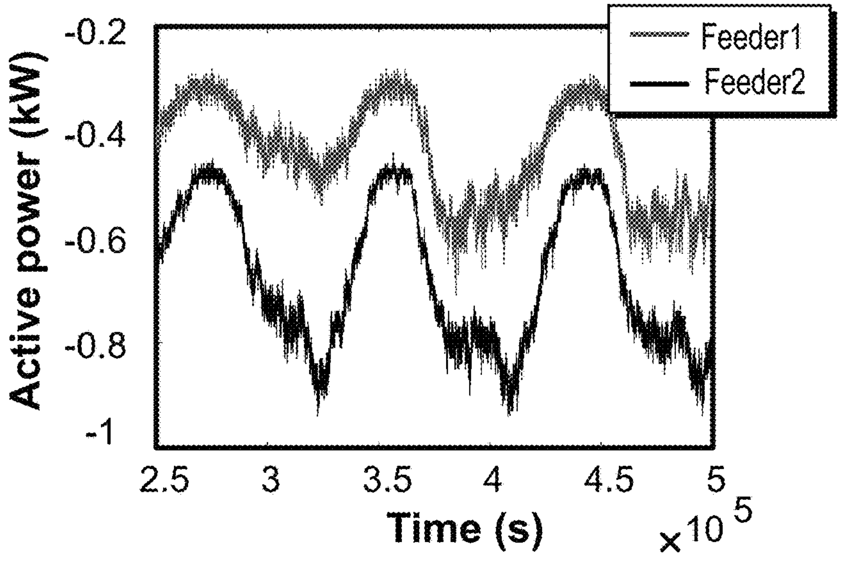
FIG. 9 shows active power vs. time at 1-s resolution measured at two feeder head-ends for the CEC system according to an embodiment of the disclosure.
Figure 10:
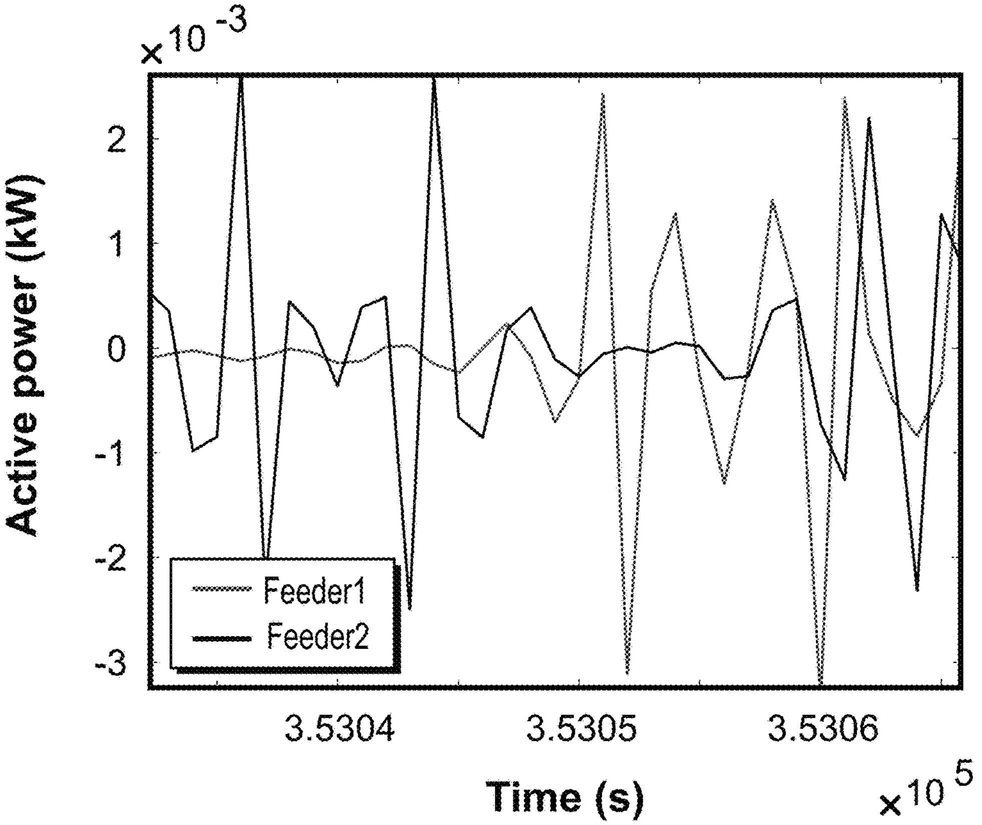
FIG. 10 shows a zoomed-in view of the active power demand of the two feeders, after removal of the DC offset between them according to an embodiment of the disclosure.
Figure 11:
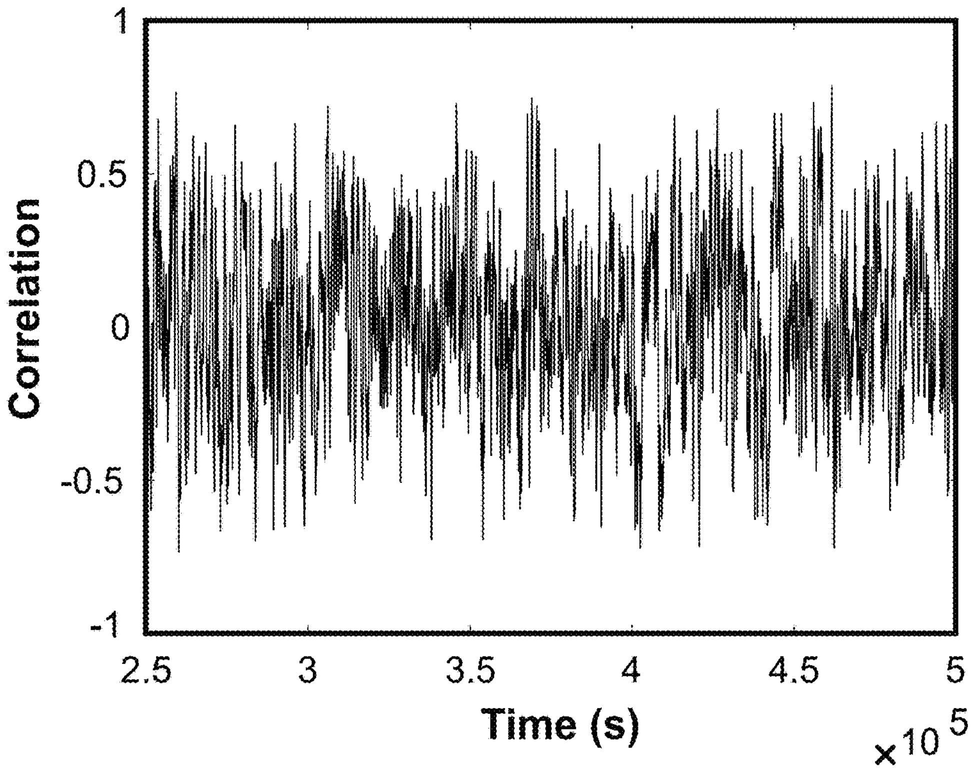
FIG. 11 shows Pearson's correlation vs. time between the active power demand of the two CEC feeders according to an embodiment of the disclosure.
Figure 12:
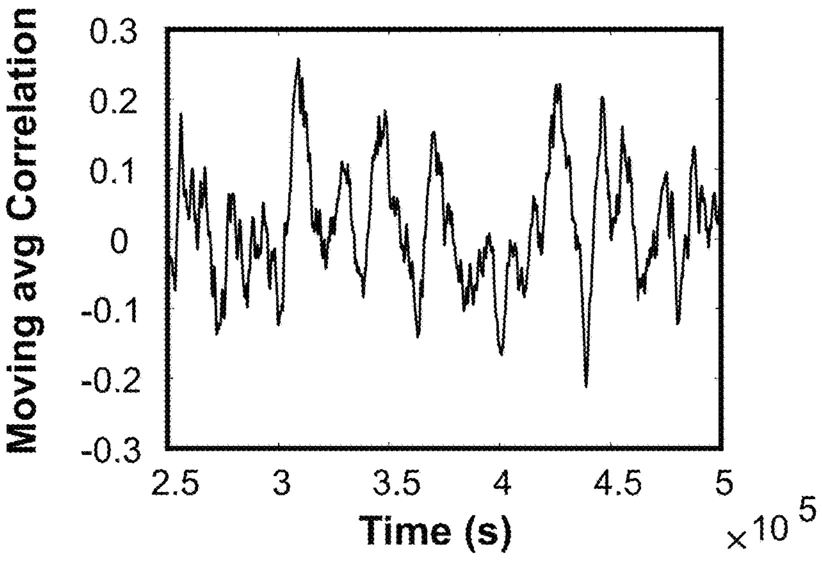
FIG. 12 shows moving-average correlation vs. time between the active power demands of the two CEC feeders according to an embodiment of the disclosure.

FIG. 9 shows the active power vs. time at 1-s resolution measured at the head ends of two similar feeders, for a small segment of the data recorded in June 2015. The CEC data shows a correlated diurnal variation, but superimposed on that is a higher-frequency uncorrelated variation. FIG. 10 shows a tightly-zoomed view of a section of the data in FIG. 9, highlighting this higher-frequency variation. FIG. 11 shows Pearson's correlation calculated on the data set in FIG. 9, and FIG. 12 shows the results in FIG. 11 after passage through a moving-average filter. The correlation in FIG. 11 shows "noisy" behavior similar to that in FIG. 7, with a low mean value as indicated by FIG. 12.

Demonstration of Unintentional Loop Formation Detection

Figure 13:
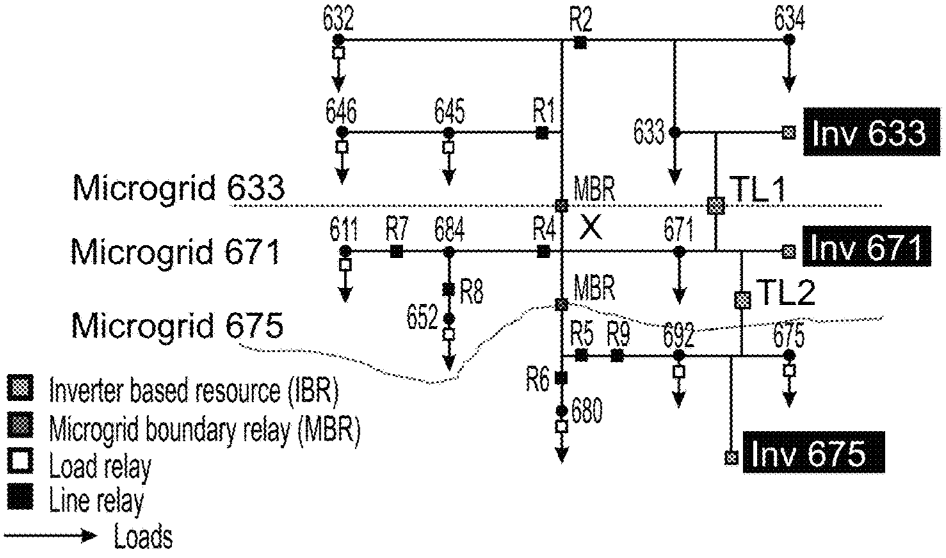
FIG. 13 shows a one-line diagram of the IEEE 13-bus distribution test circuit, partitioned into three microgrids, each with an inverter-based source and with two added tie lines and tie-line breakers TL1 and TL2 according to an embodiment of the disclosure.
Figure 14:
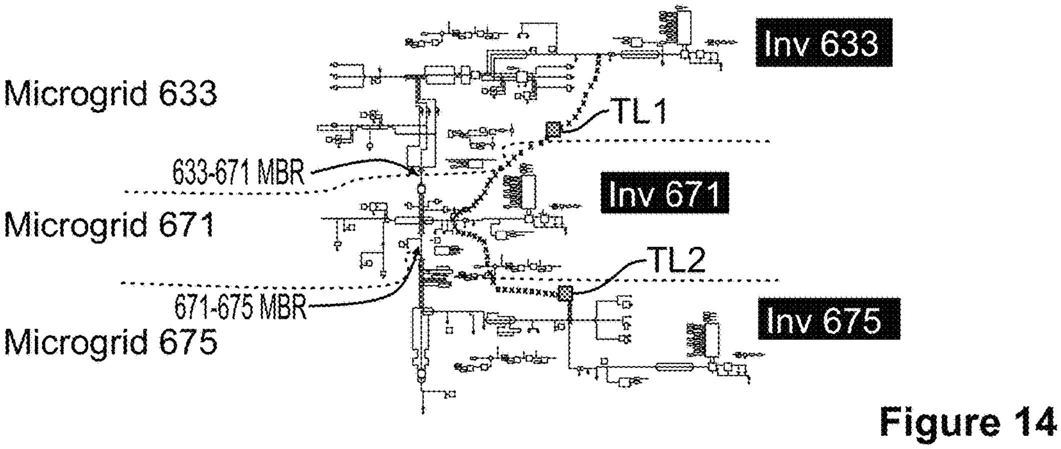
FIG. 14 shows a PSCAD model of the system in FIG. 13 according to an embodiment of the disclosure.
Figure 15:
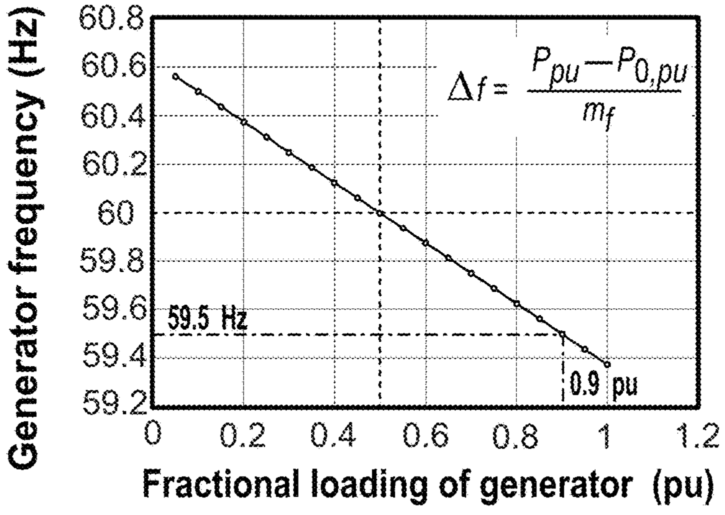
FIG. 15 shows power-frequency droop characteristic used in the inverters according to an embodiment of the disclosure.

The use of correlation or MAE to detect unintentional loop formation was demonstrated in simulation using PSCAD™, a power systems electromagnetic transient (EMT) simulation tool. The IEEE 13-bus distribution test system was partitioned into three microgrids. FIG. 13 shows a simplified one-line diagram of the 13-bus system, and FIG. 14 shows the actual PSCAD model. The blue dashed lines indicate the boundaries between the microgrids. Microgrid Boundary Relays (MBRs) connect the microgrids to one another after a specific time has elapsed and synchronization-check conditions are met. Each microgrid has an inverter-based source, the locations of which are indicated by the heavy black boxes along the right side of FIGS. 13 and 14. The numbers 633, 671, and 675 in the black boxes indicate the node number in the IEEE 13-bus test feeder to which each inverter is connected. For this work, two tie lines and two tie-line breakers TL1 and TL2 were added to the 13-bus model. These are shown in green in FIGS. 13 and 14. The two tie-line breakers TL1 and TL2 are normally open. During self-assembly, the decision that must be made in real-time, following the flowchart in FIG. 4, is whether breakers TL1 and TL2 can be closed without creating a closed loop. The inverters are represented in PSCAD using a generic H-bridge model switching at 3.6 kHz with forward- and backward-rotating dq0-frame grid-forming controls. The inverters have a linear power-frequency droop characteristic as shown in FIG. 15. The microgrids are numbered 633, 671, and 675, corresponding to the number of the inverter in that microgrid. In the PSCAD model in FIG. 14, each microgrid includes a pseudo-random load that consists of a small parallel R-L load (about 2% of the total microgrid load) that is switched on and off at pseudo-random times using the switching function generator shown in FIG. 16. The simulation time step used is 20 μs, and the sampling rate of the data for post-processing is 5 kHz.

The simulations start with the three microgrids all operating independently (all tie-line breakers and microgrid boundary relays are open). At t=15 s, the MBR between microgrids 671 and 675 is allowed to close once its synchronization check conditions are satisfied, and at t=35 s, the MBR between microgrids 633 and 671 is allowed to close. In each microgrid, the frequency is measured using a phase-locked loop (PLL) which is then filtered using a first-order low-pass filter with a 0.5-sec time constant. Two categories of use cases were studied: 1) "unmatched" cases in which the loading is such that there is a steady-state frequency difference between adjacent microgrids; and 2) "matched" cases in which the microgrid loads were manipulated so that the steady-state frequencies between two adjacent microgrids were essentially equal. In the plots below, a red vertical dashed line marks the time at which the MBR between microgrids 671 and 675 is allowed to close, and a purple vertical dashed line marks the time at which the MBR between microgrids 633 and 671 is allowed to close. The cases presented below provide representative results.

A. Unmatched Load Case, Using Correlation

Figure 16:
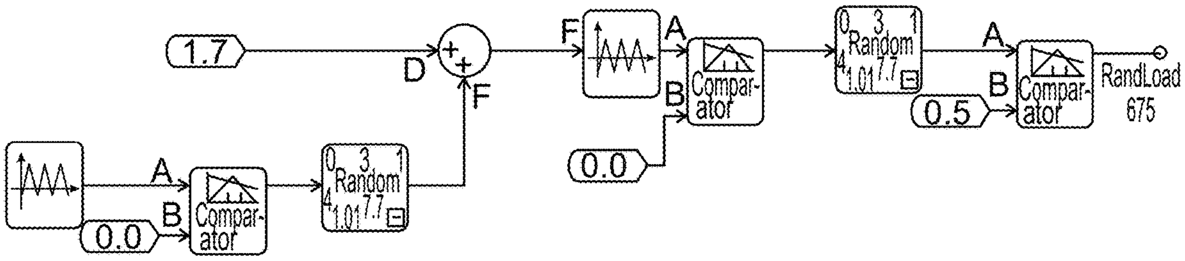
FIG. 16 shows a random load model used in the PSCAD modeling according to an embodiment of the disclosure.
Figure 17:
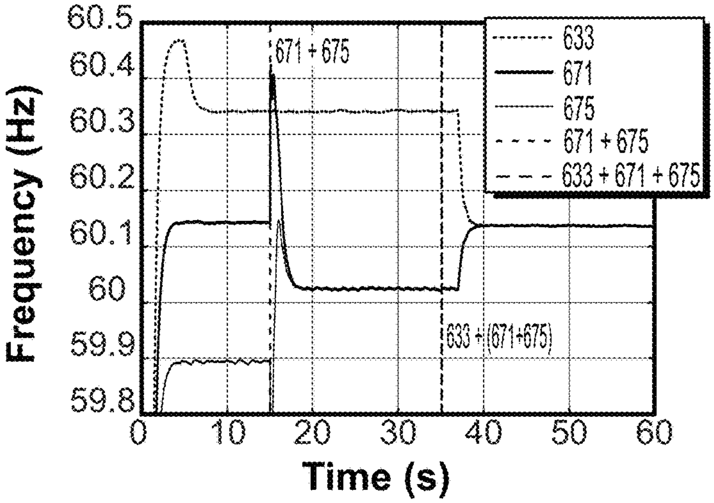
FIG. 17 shows measured frequencies for an unmatched load case according to an embodiment of the disclosure.
Figure 18:
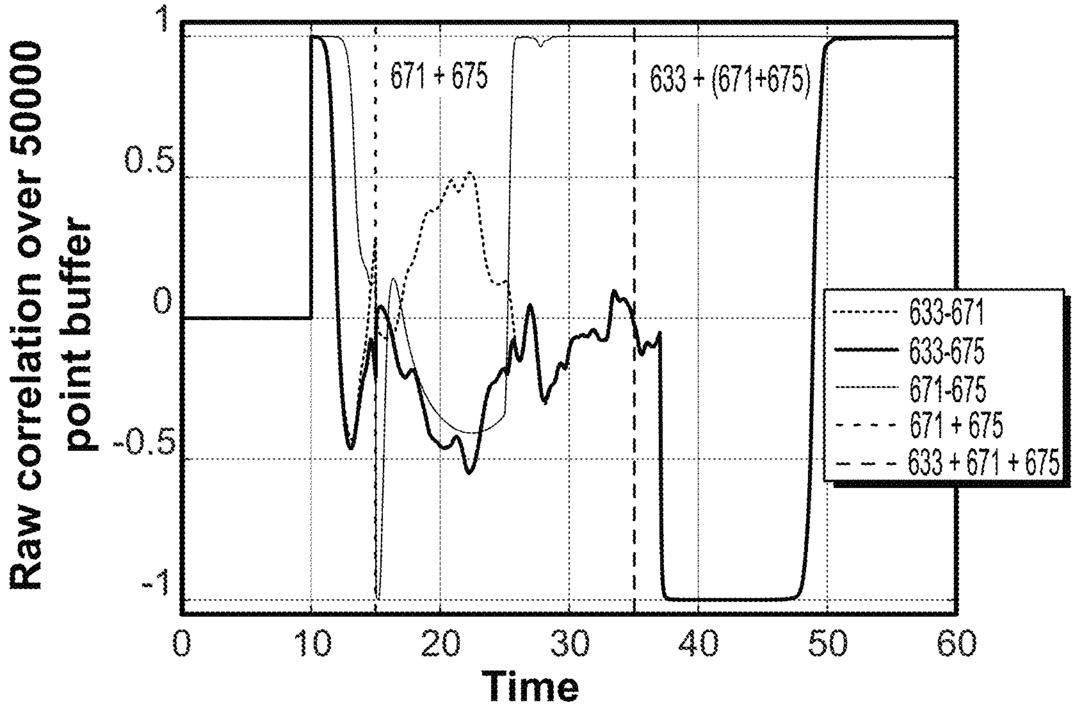
FIG. 18 shows raw correlations vs. time for an unmatched load case according to an embodiment of the disclosure.
Figure 19:
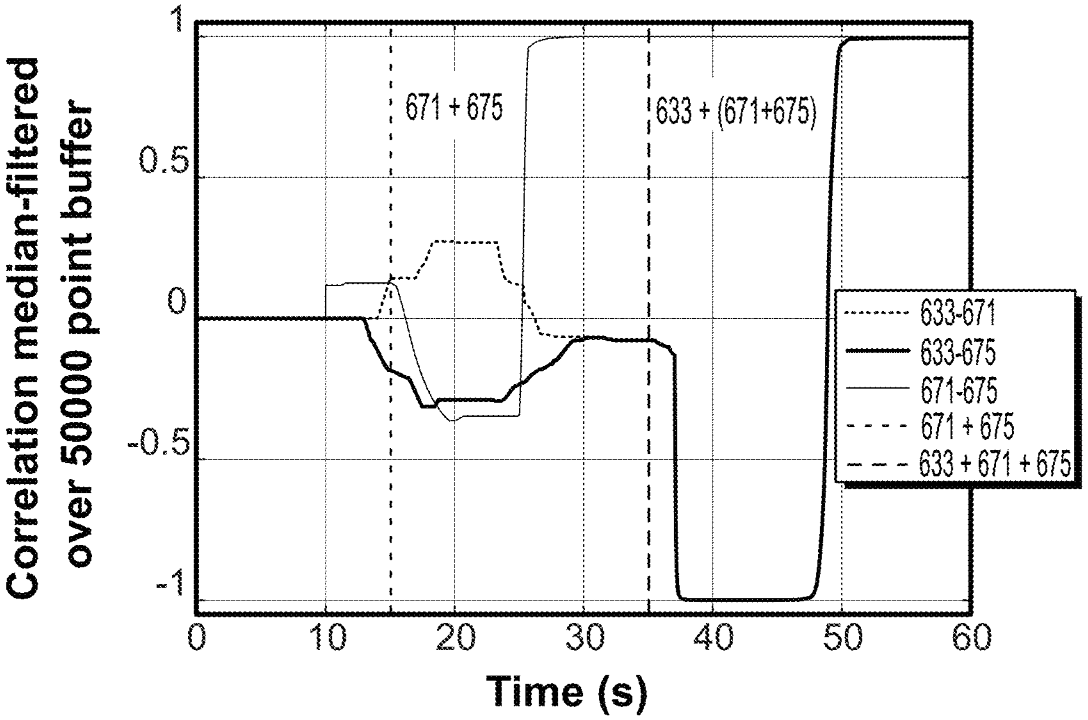
FIG. 19 shows moving-median-filtered correlation vs. time for an unmatched load case according to an embodiment of the disclosure.

FIGS. 16-18 show correlation-based results for an "unmatched load case", with the correlation calculated using MATLAB's "corr" function calculated over a sliding window. FIG. 16 shows the 5 kHz-sampled frequency vs. time for each of the three microgrids in an unmatched load case. Until t=15, all three microgrids are independent, and FIG. 16 indicates that there is a steady-state difference in frequency between any two microgrids. In this period, any two microgrids could be connected without forming a loop. Just after t=15 s, the 671-675 MBR closes, and the frequencies of those two microgrids become equal as their inverters share load according to the droop characteristic (FIG. 13). Now if TL2 (FIG. 15) were closed, a closed loop would be formed. At roughly t=37 s, the 633-671 MBR closes, and after that, all three microgrids have the same average frequency. Following this, the closure of either TL1 or TL2 would form a loop, so the closure of either TL1 or TL2 should be blocked.

FIG. 17 shows the unfiltered (raw) correlations vs. time over a 50,000-point (10-second) moving buffer between each pair of frequencies. (For the first 10 sec of the simulation the buffers are filling.) The trace labeled 633-671 shows the correlation between the frequencies on either side of TL1, and 671-675 shows the correlation between the frequencies on either side of TL2. (The correlation between 633 and 675 is also included.) FIG. 17 shows that the correlation of frequencies between any two independent microgrids is low (less than 0.5), but as soon as any two microgrids are connected at one point, such that connection at a second point would form a loop, the correlation between their frequencies rises rapidly and remains above 0.98. FIG. 18 shows the correlations of FIG. 17 after passing through a moving-median filter with a 50,000-point (10-second) buffer. The median-filtered results increase the margin between connected and disconnected cases while preserving a reasonable speed of response. As predicted, the independent microgrids have uncorrelated frequencies and a tie line relay between them could be allowed to close, but as soon as the microgrids are connected and a loop becomes possible, their frequencies are strongly correlated, and the closure of a relay seeing these frequencies on either side should be blocked.

B. Matched Load Case, Using Correlation

Figure 20:
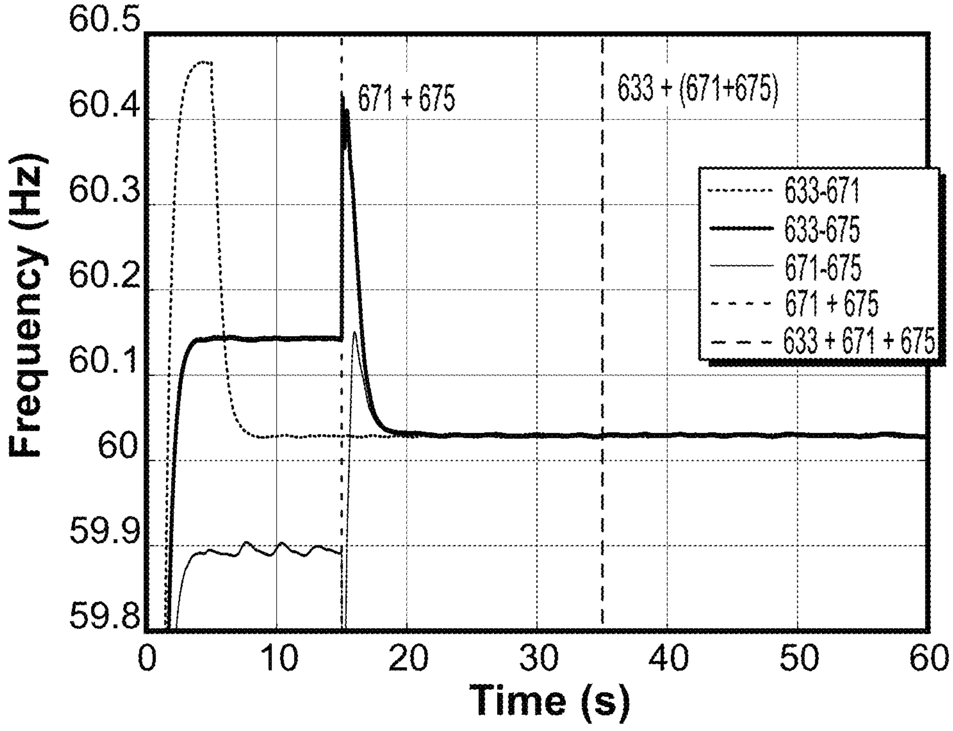
FIG. 20 shows measured frequencies for a matched load case according to an embodiment of the disclosure.
Figure 21:
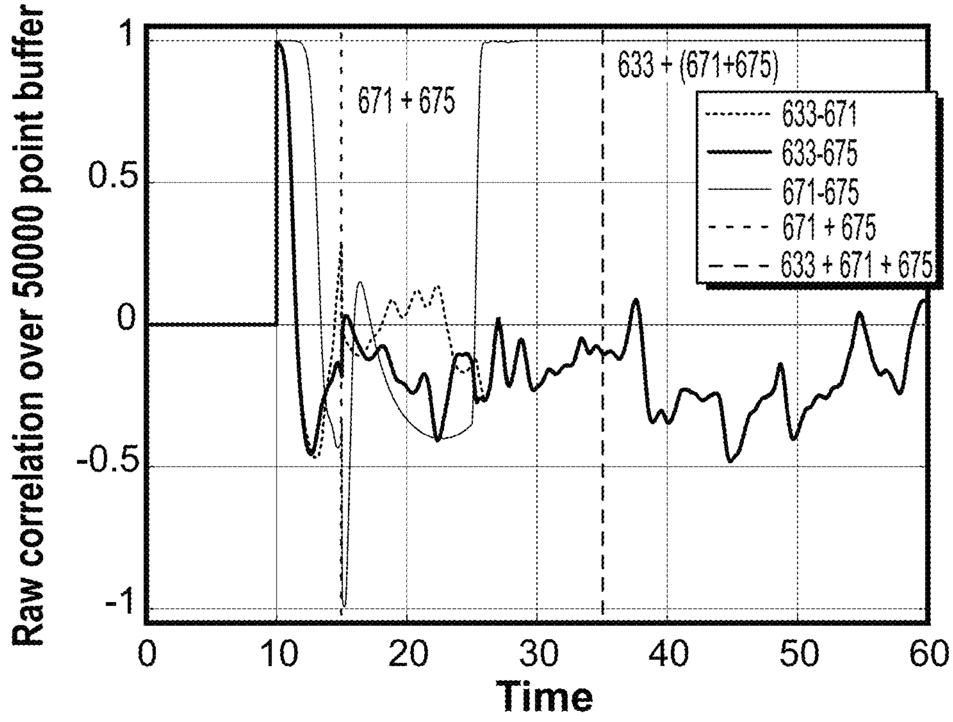
FIG. 21 shows raw correlations vs. time for a matched load case according to an embodiment of the disclosure.
Figure 22:
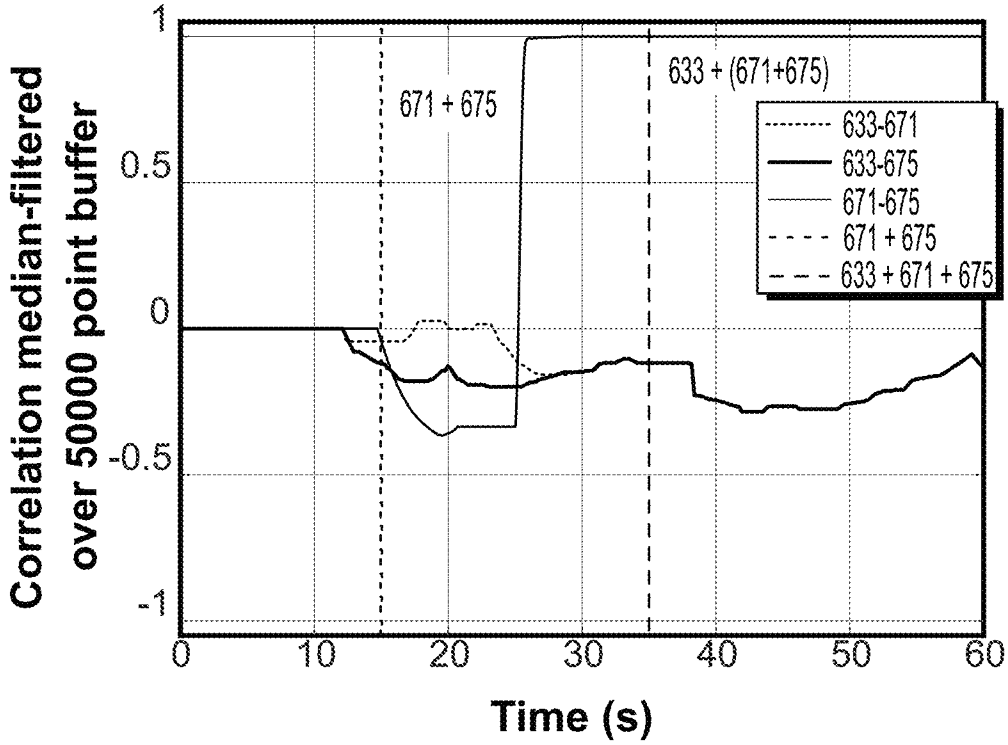
FIG. 22 shows moving-median-filtered correlations vs. time for a matched load case according to an embodiment of the disclosure.
Figure 23:
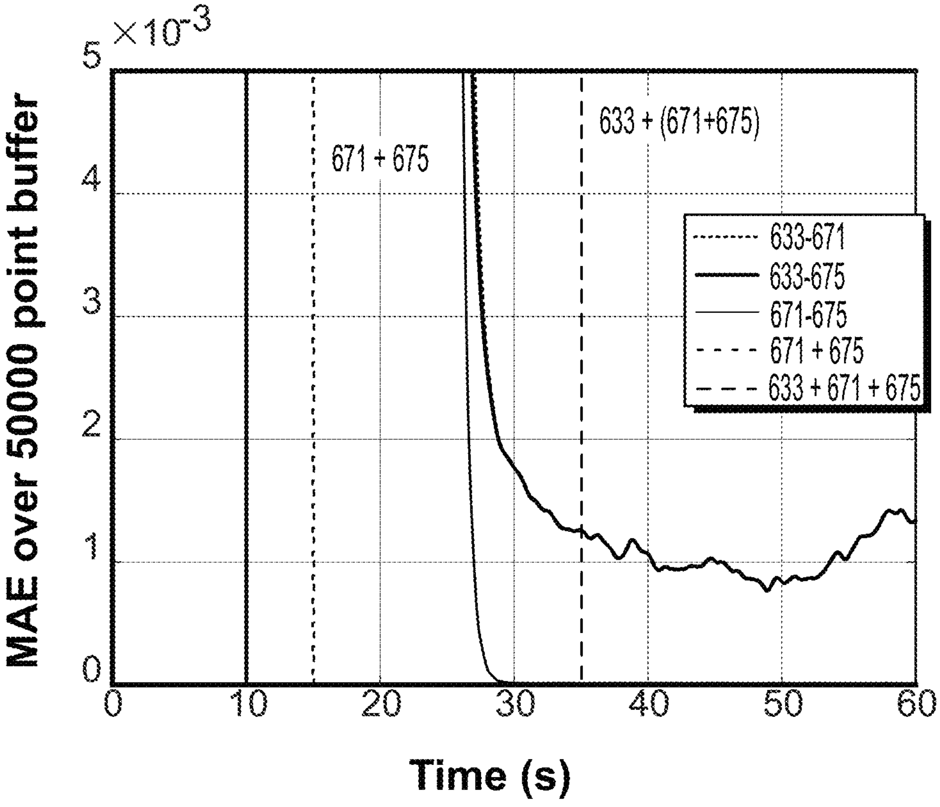
FIG. 23 shows MAE vs time for a matched load case according to an embodiment of the disclosure.

FIGS. 20-22 show correlation-based results for a "matched load case". In this case, the load of microgrid 633 was manipulated so that after the 671-675 MBR closes, the average frequency of that 671+675 combined microgrid is equal to that of microgrid 633. FIG. 20 shows the measured frequencies in the three microgrids. Once the 671-675 MBR closes (just after t=15 s), the frequencies of those two microgrids become equal, and they align very closely with the frequency of microgrid 675, which is still independent. Under this condition, TL1 cannot be closed without forming a loop, but TL2 could be closed, and thus these conditions must be differentiated. FIG. 21 shows the unfiltered Pearson's correlations between each pair of measured frequencies, calculated using MATLAB's "corr" function [24] over a sliding window, and FIG. 22 shows the results from FIG. 21 after passing through a moving median filter. FIGS. 21 and 22 show that the 633-671 correlation is near unity after these two microgrids are connected, indicating that closing further connections between them would form loops. The 633-675 and the 671-675 correlations remain very low, indicating that the closure of a relay between these could be allowed.

C. Matched Load Case, Using MAE

FIG. 22 shows MAE-based results for the matched-load case. Microgrid 633 is independent throughout the simulation, and the MAE between microgrid 633's frequency and that of either of the other two microgrids hovers around $1\times10^{-3}$ Hz. Microgrids 671 and 675 connect just after t=15 s, and after that time the MAE between their frequencies drops to just over $1\times10^{-5}$ Hz.

In this exemplary embodiment, MAE is calculated over a sliding window as $$MAE_k = \frac{\sum_{i=k}^{k+N} |f_{1,i} - f_{2,i}|}{N} \tag{4}$$

where k is the starting index of the MAE window, $MAE_k$ is the value of the MAE over the window starting at point k, $f_1$ and $f_2$ are the two vectors of frequency measurements, and N is the number of data points over which the MAE is calculated (here, 50,000). In other embodiments, other MAE formulations/calculations may be used.

As expected, the MAE between the frequencies in the two connected microgrids is much smaller (here, two orders of magnitude smaller) than between independent microgrids. The connected versus non-connected cases are clearly distinguished, and thus MAE can also be used to prevent unintentional loop formation.

DISCUSSION

The results shown above show that filtered correlation and mean absolute error can both be used to reliably indicate whether the closure of a relay would lead to the formation of a loop. In the correlation-based implementation, closure of the relay can be allowed if the correlation between the filtered frequencies of the voltages on either side of the relay is below some threshold (say, <0.9), but closure should be blocked if that correlation is above that threshold because this indicates that closure of the relay could create a loop. Filtering of the correlation results in a method that has a good margin between the two cases, and acts within a time frame suitable for this application. In the MAE-based implementation, there was a large detection margin between the two cases with no further filtering; a threshold of 1×10-4 Hz would allow detection and preserve a large buffer against nuisance trips.

The purpose of the loop-detection function is to allow any two independent power systems to be connected to one another at one point only. Any time two independent power systems are connected to one another, significant changes in available fault current magnitude and direction as well as other parameters can occur, and these changes may impact the operation of protection systems and the dynamic performance of the connected systems. Such impacts must be addressed to ensure that the resulting interconnected system remains stable and properly protected.

The disclosed systems and methods avoid the creation of unintentional, undesirable loops. The only inputs required for either implementation of the method are the frequencies of the voltages on either side of the relay in question. One implementation of the method relies on the fact that loads adjacent to one another have uncorrelated variations on short time scales. In unconnected systems, those uncorrelated load variations will reflect off the droop curves of the inverter-based sources in the microgrids to produce uncorrelated frequency variations. Thus, a lack of correlation in the frequency indicates that the systems on either side of the relay are not yet connected, and the relay can be closed without forming a loop. When the voltages on either side of the relay come from the same set of sources, the correlation between frequencies on either side of the relay becomes high. In this case, closure would form a loop, and closure can then be blocked if the system is not designed for looped operation.

Another implementation of the method relies on the fact that the magnitudes of the difference in frequencies on either side of the relay at each sample time will typically be much larger when the systems are independent than when they are connected. Thus, the mean absolute error between the frequencies can also provide a means for differentiating between independent and connected cases and can be used to prevent undesirable loop formation.

PSCAD simulations using the IEEE 13-bus system partitioned into three microgrids with three grid-forming inverters show that both implementations work in self-assembling systems with droop-controlled inverter-based sources. These methods can facilitate the deployment of self-assembling or self-organizing power systems for resilience in cases where the formation of loops must be avoided.

While the exemplary embodiments illustrated in the figures and described herein are presently preferred, it should be understood that these embodiments are offered by way of example only. Accordingly, the present application is not limited to a particular embodiment, but extends to various modifications that nevertheless fall within the scope of the appended claims. The order or sequence of any processes or method steps may be varied or re-sequenced according to alternative embodiments.

It is important to note that the construction and arrangement of the various exemplary embodiments is illustrative only. Although only a few embodiments have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited in the claims. For example, elements shown as integrally formed may be constructed of multiple parts or elements, the position of elements may be reversed or otherwise varied, and the nature or number of discrete elements or positions may be altered or varied. Accordingly, all such modifications are intended to be included within the scope of the present application. The order or sequence of any process or method steps may be varied or re-sequenced according to alternative embodiments. In the claims, any means-plus-function clause is intended to cover the structures described herein as performing the recited function and not only structural equivalents but also equivalent structures. Other substitutions, modifications, changes and omissions may be made in the design, operating conditions and arrangement of the exemplary embodiments without departing from the scope of the present application.

It should be noted that although the figures herein may show a specific order of method steps, it is understood that the order of these steps may differ from what is depicted.

What is claimed is:

1. A line relay, comprising:

a processor that measures voltage on either side of the line relay, calculates frequency on either side of the line relay, and determines correlation or mean absolute error (MAE) between the frequency on either side of a line relay, the processor compares the correlation or MAE between the determined frequencies over time and determines if a change in the correlation or MAE identifies that closing a specific switch would create or not create an unintentional loop in a power system, the processor sending out a signal to the line relay to close the line relay upon determining that closing the switch would not create an unintentional loop; and a switch;

wherein the MAE is determined by:

$$MAE_k = \frac{\sum_{i=k}^{k+N} |f_{1,i} - f_{2,i}|}{N}$$

where k is the starting index of the MAE window, $MAE_k$ is the value of the MAE over the window starting at point k, $f_1$ and $f_2$ are the two vectors of frequency measurements, and N is the number of data points over which the MAE is calculated.

2. The line relay of claim 1, wherein correlation is determined by a statistical correlation calculation selected from the group comprising Pearson's r, Spearman's rho (ρ), and Kendall's tau (τ).

3. A power system, comprising:

at least two portions of the power system that can be electrically separated from one another;

a line relay electrically connecting the at least two portions of the power system;

wherein the line relay comprises:

a processor that measures voltage on either side of the line relay, calculates frequency on either side of the line relay, and determines correlation or mean absolute error (MAE) between the frequency on either side of a line relay, the processor compares the correlation or MAE between the determined frequencies over time and determines if a change in the correlation or MAE identifies that closing a specific switch would create or not create an unintentional loop in a power system, the processor sending out a signal to the line relay to close the line relay upon determining that closing the switch would not create an unintentional loop; and a switch for closing the electrical connection between the first and second power distribution circuits;

wherein the MAE is determined by:

$$MAE_k = \frac{\sum_{i=k}^{k+N} |f_{1,i} - f_{2,i}|}{N}$$

where k is the starting index of the MAE window, $MAE_k$ is the value of the MAE over the window starting at point k, $f_1$ and $f_2$ are the two vectors of frequency measurements, and N is the number of data points over which the MAE is calculated.

4. The system of claim 3, wherein the at least two portions are distribution circuits that can be electrically separated.

5. The system of claim 3, wherein the line relay is between two distribution circuits.

6. The system of claim 3, wherein the line relay is within a distribution circuit.

7. The system of claim 3, wherein the correlation is determined by a statistical correlation calculation selected from the group comprising Pearson's r, Spearman's rho (ρ), and Kendall's tau (τ).

8. A method for preventing a closed loop in a power system, comprising:

disposing between a first and a second power distribution circuit a line relay that determines a safe condition for closing the line relay;

wherein the line relay comprises:

a processor that measures voltage on either side of the line relay, calculates frequency on either side of the line relay, and determines correlation or mean absolute error (MAE) between the frequency on either side of a line relay, the processor compares the correlation or MAE between the determined frequencies over time and determines if a change in the correlation or MAE identifies that closing a specific switch would create or not create an unintentional loop in a power system, the processor sending out a signal to the line relay to close the line relay upon determining that closing the switch would not create an unintentional loop; and a switch;

wherein the MAE is determined by:

$$MAE_k = \frac{\sum_{i=k}^{k+N} |f_{1,i} - f_{2,i}|}{N}$$

where k is the starting index of the MAE window, $MAE_k$ is the value of the MAE over the window starting at point k, $f_1$ and $f_2$ are the two vectors of frequency measurements, and N is the number of data points over which the MAE is calculated.

9. The method of claim 8, wherein correlation is determined by a statistical correlation calculation selected from the group comprising Pearson's r, Spearman's rho (ρ), and Kendall's tau (τ).

* * * * *